United States Patent [19]

Kuligowski et al.

[11] 3,961,205

[45] June 1, 1976

[54] METHOD AND APPARATUS FOR OBTAINING A SIGNAL HAVING A LOW HARMONIC CONTENT

[75] Inventors: Gerd Kuligowski; Eckart Cattien, both of Berlin, Germany

[73] Assignee: Siemens Aktiengesellschaft, Munich, Germany

[22] Filed: Feb. 20, 1974

[21] Appl. No.: 444,124

[30] Foreign Application Priority Data

Feb. 23, 1973 Germany .......................... 2309809

[52] U.S. Cl. ............................... 307/261; 307/229; 307/251

[51] Int. Cl.² ......................................... H03K 5/00

[58] Field of Search .......... 307/238, 235, 251, 229; 328/127, 151

[56] References Cited

UNITED STATES PATENTS 3,667,055 5/1972 Uchida ............................. 328/127

*Primary Examiner*—Stanley D. Miller, Jr.
*Assistant Examiner*—B. P. Davis
*Attorney, Agent, or Firm*—Kenyon & Kenyon Reilly Carr & Chapin

[57] ABSTRACT

A method of obtaining a final signal of low harmonic content from a waveform consisting of individual amplitude steps approximating an original signal such as a measurement quantity or the like includes successively interpolating between the values of each two mutually adjacent ones of the individual amplitude steps over a period of time defined by the time spacing between corresponding points of the mutually adjacent steps.

A circuit arrangement for carrying out the method contains an integrator which has two storage devices on the input side; the one storage device is connected through a switch device through a further switch to an arrangement which transmits the individual amplitude steps. A control device is associated with the switches.

10 Claims, 3 Drawing Figures

METHOD AND APPARATUS FOR OBTAINING A SIGNAL HAVING A LOW HARMONIC CONTENT

BACKGROUND OF THE INVENTION

The invention relates to a method and apparatus for obtaining a signal low in harmonics from a signal consisting of individual amplitude steps.

In telemetering, for instance, an analog measuring quantity is often quantized at the input of a transmission channel into a number of amplitude steps to obtain a transmission accuracy as high as possible. Related to each amplitude value is a definite pulse sequence through which a code is obtained. At the other end of the transmission channel, decoding is performed, so that again an analog measuring quantity is obtained which is put together from individual amplitude steps. This analog quantity has a relatively high harmonic content. The harmonics of the highest frequencies can be filtered out by means of a lowpass filter, which just passes the upper limit frequency of the signal; however, the harmonics of low-frequency processes are passed because the filter is constructed to the upper frequency limit. Also an analog measuring quantity filtered by means of a filter, which quantity is obtained from a measurement quantity consisting of individual amplitude steps, therefore still has a rather considerable harmonic content.

Further, in measurement technology, for example, in the measurement of noise, the measurement quantities are sometimes converted continuously into amplitude steps or digital data. These digital data are stored and converted back into analog form after a time delay. The quantity, which consequently consists of individual amplitude steps, is then also fed to filters, which filter out part of the harmonics and the sampling frequency. In this connection, reference may be had to *Siemens Zeitschrift*, vol. 45 (1971) No. 10, pages 634 and 635. A simulation, low in harmonics, of the measurement quantity at the output, as compared to the measurement quantity at the input, cannot be completely achieved in this manner.

SUMMARY OF THE INVENTION

Accordingly, it is an object of the invention to provide a method of obtaining a final signal low in harmonic content. The final signal is, for example, representative of an original measurement quantity. It is a more specific object of the invention to provide a method of obtaining a final signal from an original signal approximated by individual amplitude steps. From such an original signal, the final signal can be obtained and have a very low harmonic content and therefore correspond, to a large extent, to the original measurement quantity before it was quantized into the individual amplitude steps.

It is another object of the invention to provide a circuit arrangement for performing the method of the invention.

To achieve the method objects of the invention and according to a feature thereof, an interpolation is performed in a process of the kind described about between each value of an amplitude step and the value of the next amplitude step over a time period which is given by the time spacing of corresponding points of the two amplitude steps. The interpolation between the amplitude values is preferably linear. The method of the invention indicates that it is also possible to take the variation of the signal in the past into consideration in the interpolation or to apply an interpolation of higher order.

According to another feature of the invention, a linear interpolation is therefore performed between the value at the front flank of an amplitude step and the value at the front flank of the next amplitude step whereby a curve train is generated which fits the shape of the original analog measurement quantity considerably better than heretofore attainable, or a curve train is generated which approaches the expected actual curve shape considerably better than was heretofore possible, using filters. The linear interpolation is, of course, possible not only between the values of successive amplitude steps between their respective front flanks, but can be performed generally between corresponding points of successive amplitude steps.

The advantage of the method according to the invention is mainly seen in the fact that the harmonic content can be reduced to values which are considerably lower than those attainable through the use of filters, as filters pass the harmonic components of low-frequency processes.

To carry out the method according to the invention, a circuit arrangement is provided. The circuit arrangement according to the invention includes an integrator to the input of which two storage devices are connected; the one storage device is connected through a switch also to the output of the integrator, and the other storage device through a further switch also to an arrangement which supplies the measurement quantity consisting of individual amplitude steps, and a control device is associated with the switches; these switches are advantageously field-effect transistors.

This embodiment of the circuit arrangement according to the invention has the advantage that inaccuracies generated in the integrator are cancelled; the output quantity of the integrator, which is identical with the output quantity of the circuit arrangement according to the invention, is always stored in the one storage device and fed back to the input of the integrator, whereby the sum or difference formation performed there leads to an increase of the output quantity over and above the degree necessary per se, or to a corresponding decrease, if the integrator operates with certain internal inaccuracies.

The control device can be constructed in different ways; it is essential that it is influenced in some manner as a function of the individual amplitude steps or of their presence and controls the switches accordingly, since the switches must be controlled by a control device in dependence upon the individual amplitude steps or the duration of the individual amplitude steps.

The storage devices of the circuit arrangement according to the invention also can be constructed in different ways. It is advantageous because of the simplicity of configuration when the storage devices each consist of a capacitor; an impedance transformer is arranged between each capacitor and the input of the integrator in such a manner that its high-impedance input is connected with the capacitor. This achieves the effect that during the integration time, which lasts from one operation of the switches to the next one, or is given by the spacing in time of corresponding points of two successive amplitude steps, constant currents are fed into the integrator.

The integrator can be configured in a manner known per se by an operational amplifier connected as a summing integrator, as described, for example, in the German journal "*messen + pruefen*", 1969, page 667.

Although the invention is illustrated and described herein as method and apparatus for obtaining a signal having a low harmonic content, it is nevertheless not intended to be limited to the details shown, since various modifications may be made therein within the scope and the range of the claims. The invention, however, together with additional objects and advantages will be best understood from the following description and in connection with the accompanying drawings.

DESCRIPTION OF THE PREFERRED EMBODIMENTS OF THE INVENTION

Figure 1:
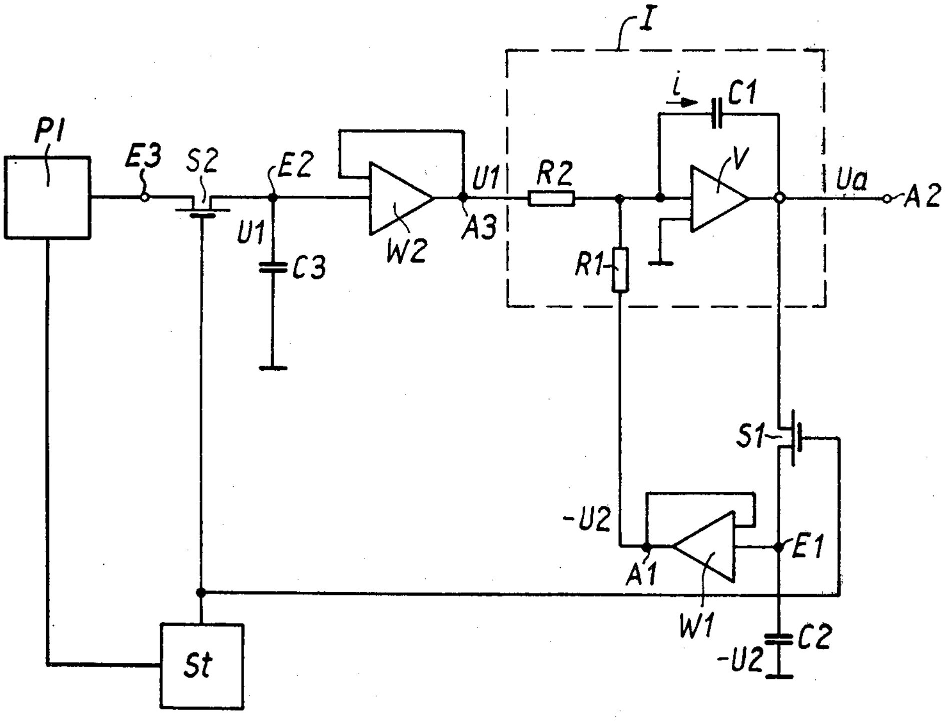
FIG. 1 is a schematic diagram showing the circuit arrangement of the invention for performing the method of the invention.

The embodiment of the circuit arrangement according to the invention shown in FIG. 1 contains an integrating arrangement I which includes an operational amplifier V connected as a summing integrator. The operational amplifier V is provided with a capacitor C1 between the input and the output and includes at its input a resistor R1 and a further resistor R2. The resistor R1 is connected with the output A1 of an impedance transformer W1 comprising an operational amplifier connected accordingly. A storage device made up of a capacitor C2 is connected to the high-impedance input E1 of the impedance transformer W1. The input of the impedance transformer W1 and the capacitor C2 are connected to the output A2 of the integrating arrangement I through first switch means S1 in the form of a field-effect transistor.

The further resistor R2 at the input of the operational amplifier V is connected to the output A3 of a further impedance transformer W2 likewise made up of an operational amplifier appropriately connected. The high-impedance input E2 of the impedance transformer W2 is connected to a further storage device constituted by a capacitor C3. The capacitor C3 is furthermore connected to an input terminal E3 of the circuit arrangement through a second switch means S2 in the form of a field-effect transistor. This input terminal E3 is connected with an arrangement P1 for supplying a signal consisting of individual amplitude steps.

The switches S1 and S2 are controlled by a control device *St* and are connected for this purpose with this control device. The control device *St* is operated so that it briefly closes and opens the switches S1 and S2 in dependence upon the occurrence of the amplitude steps. The control device *St* is also connected to the arrangement P1 for supplying the signal consisting of individual amplitude steps. The Control device *St* delivers during each amplitude step a closing pulse to the switches S1 and S2 where the closing pulses occur in a time sequence which is given by the time spacing of corresponding points of successive amplitude steps.

The operation of the circuit arrangement according to the invention will now be described.

If an amplitude step occurs at the input terminal E3 of the circuit arrangement according to the invention, the further switch S2 is briefly closed during the presence of this amplitude step and the capacitor C3 is caused to become charged. The voltage U1 produced at this capacitor C3 is then proportional to the value of the amplitude step. The impedance transformer W2, which follows the capacitor C3, develops at its output A3 a corresponding voltage U1.

At the same time, the switch S1 is closed briefly, and a voltage corresponding to the voltage −U2 at the output A2 of the integrating arrangement I is stored in the capacitor C2. The impedance transformer W1 then develops at its output A1 a corresponding voltage −U2. This voltage −U2 is then a measure for the value of the preceding amplitude step.

Consequently, a current *i* is fed to the capacitor C1 of the integrating arrangement I; this action can be expressed by the following equation (1):

$$i = + \frac{U1}{R2} - \frac{U2}{R1}. \qquad (1)$$

At the output A2 of the integrating arrangement I there then is obtained a voltage U*a* which can be described by the following equation (2):

$$Ua = -\frac{1}{C1} \cdot \int_0^t i.dt - U2. \qquad (2)$$

Since the voltages U1 and U2 can be assumed as constant during the integration time, from equations (1) and (2) the following equation (3) is obtained:

$$Ua = -\frac{1}{C1} \cdot +\left(\frac{U1}{R2} - \frac{U2}{R1}\right) \cdot t - U2, \qquad (3)$$

where *t* is the time between two closings of the switches S1 and S2.

If the resistors R1 and R2 are chosen equal and are designated with R, then equation (4) follows from equation (3):

$$Ua = -\frac{1}{R.C1} \cdot (+U1 - U2).t - U2 \qquad (4)$$

Because, according to the statement of the problem, Ua should be exactly as large as −U1, there is obtained from equation (4) the equation:

$$-U1 = -\frac{1}{R.C1} \cdot (+U1 - U2).t - U2. \qquad (5)$$

This equation is fulfilled only if:

$$t = C1 \,.\, R$$

This is the integrating time of the integrating arrangement. It is thereby demonstrated that the capacity of the capacitor C1 and the value of the ohmic resistance R must be chosen so that the product of these two quantities corresponds to the time between corresponding points of successive amplitude steps. Then, the problem of forming a signal low in harmonics from a signal consisting of individual amplitude steps can be solved by means of the circuit arrangement according to the invention.

Figure 2:
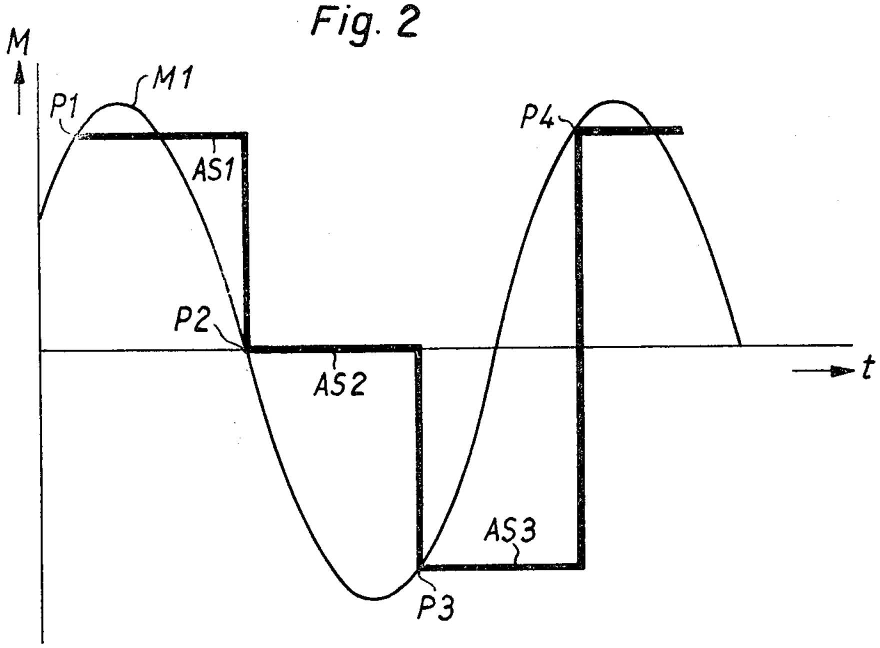
FIG. 2 shows the waveform of the original signal and the waveform of individual amplitude steps approximating the original waveform.

To explain the invention further, the measured value M is shown in FIG. 2 in diagram form versus the time t for the original analog measurement quantity M1, which is approximated by the amplitude steps AS1, AS2 and AS3. These amplitude steps can, for example, be fed to the input E3 of the circuit arrangement according to the invention shown in FIG. 3. In FIG. 3 is again shown in a similar diagram the analog measurement quantity M1 with its original wave shape and the values defining the curve of the reproduced measurement quantity M2, which is low in harmonics and is obtained by means of the circuit arrangement according to the invention utilizing the method according to the invention. The measurement quantity M2 can be taken off at the output A2 of the circuit arrangement of FIG. 1.

Figure 3:
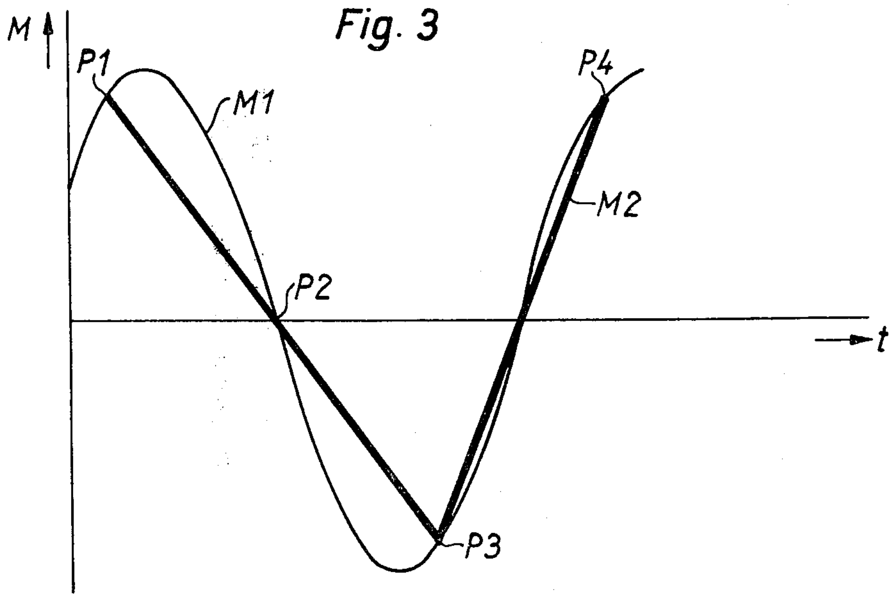
FIG. 3 illustrates the original waveform and, superimposed thereon are the interpolated values defining the final signal of low harmonic content, the final signal being representative of the original signal.

It will be seen that between the points P1 and P2, which according to FIG. 2 are described by the amplitude step *As*1, linear interpolation occurs as per FIG. 3; the situation is similar with respect to the points P2 and P3 as well as P3 and P4, between which the interpolation is likewise linear.

The invention provides a method and apparatus for obtaining a signal low in harmonics from a signal consisting of individual amplitude steps which function without the otherwise customary filters and therefore allows realization of a signal which is similar to a large extent to the original signal, that is, to the signal before it is quantized into individual amplitude steps, and therefore has a distortion which is completely negligible for all practical purposes.

What is claimed is:

1. A method of obtaining a final signal of low harmonic content from a waveform approximating an original signal such as a measurement quantity or the like, the waveform consisting of individual amplitude steps one following the other, the method comprising: applying the waveform to a circuit arrangement including: an integrator, first storage means connected to the input of said integrator, first switch means for connecting and disconnecting the first storage means to the output of the integrator, second storage means connected to the input of said integrator, and second switch means for connecting and disconnecting the second storage means for receiving the waveform of the individual amplitude steps; and, successively actuating said first and second switch means for successively interpolating in said integrator between the values of each two mutually adjacent ones of the individual amplitude steps over a period of time defined by the time spacing between corresponding points of said mutually adjacent steps.

2. The method of claim 1 wherein said interpolation is linear between each two of said values.

3. The method of claim 1, said interpolation being linear between each two of said values, one of said values being at the front flank of the first step of each two of said mutually adjacent steps and the second one of said values being at the front flank of the second step of said mutually adjacent steps whereby a set of values are obtained which define a curve approximating the original signal.

4. A circuit arrangement for obtaining a final signal of low harmonic content from a waveform approximating an original signal such as a measurement quantity or the like, the waveform consisting of individual amplitude steps one following the other, the circuit arrangement comprising: an integrator; first storage means connected to the input of said integrator; first switch means for connectng and disconnecting said first storage means to the output of said integrator; second storage means connected to said input of said integrator; second switch means for connecting and disconnecting said second storage means for receiving the waveform of the individual amplitude steps; and a control device connected to said first and second switch means for actuating the same.

5. The circuit arrangement of claim 4, said control device comprising means for supplying a switch closing pulse to said first switch means and to said second means during each of the amplitude steps in a sequence determined by the time spacing between corresponding points on each two mutually adjacent ones of the individual amplitude steps.

6. The circuit arrangement of claim 5, said control device being connected to the source of the waveform of individual amplitude steps.

7. The circuit arrangement of claim 6, said first switch means being a field-effect transistor and said second switch means being a field-effect transistor.

8. The circuit arrangement of claim 6, said first and second storage means comprising respective capacitors, the circuit arrangement further comprising a first impedance transformer connected between the capacitor of said first storage means and said input of said integrator, and a second impedance transformer connected between the capacitor of said second storage means and said input of said integrator, said impedance transformers having respective high impedance connected to respective ones of said capacitors.

9. The circuit arrangement of claim 8, said integrator comprising an operational amplifier connected as a summation integrator.

10. The circuit arrangement of claim 8, said first switch means being a field-effect transistor and said second switch means being a field-effect transistor.

* * * * *